United States Patent
Plat et al.

(10) Patent No.: US 7,015,134 B2
(45) Date of Patent: Mar. 21, 2006

(54) METHOD FOR REDUCING ANTI-REFLECTIVE COATING LAYER REMOVAL DURING REMOVAL OF PHOTORESIST

(75) Inventors: Marina V. Plat, San Jose, CA (US); Angela T. Hui, Fremont, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 278 days.

(21) Appl. No.: 10/079,775

(22) Filed: Feb. 19, 2002

(65) Prior Publication Data
US 2002/0076931 A1    Jun. 20, 2002

Related U.S. Application Data

(62) Division of application No. 09/433,591, filed on Nov. 2, 1999, now abandoned.

(51) Int. Cl.
*H01L 21/4763* (2006.01)

(52) U.S. Cl. ............ 438/636; 438/637; 438/700; 438/749

(58) Field of Classification Search .......... 438/636, 438/637, 725, 700, 749
See application file for complete search history.

(56) References Cited

U.S. PATENT DOCUMENTS

| | | | |
|---|---|---|---|
| 6,159,661 A * | 12/2000 | Huang et al. | 430/313 |
| 6,184,142 B1 * | 2/2001 | Chung et al. | 438/692 |
| 6,222,241 B1 * | 4/2001 | Plat | 257/437 |
| 6,265,751 B1 * | 7/2001 | Plat et al. | 257/437 |
| 6,268,457 B1 * | 7/2001 | Kennedy et al. | 528/39 |
| 6,423,628 B1 * | 7/2002 | Li et al. | 438/622 |
| 6,573,175 B1 * | 6/2003 | Yin et al. | 438/637 |

\* cited by examiner

*Primary Examiner*—Hsien-Ming Lee
(74) *Attorney, Agent, or Firm*—Robert A. Voigt, Jr.; Winstead Sechrest & Minick P.C.

(57) ABSTRACT

A method and system for providing a semiconductor device. The semiconductor device includes a first layer to be etched. The method and system include depositing an anti-reflective coating. At least a portion of the anti-reflective coating layer is on the first layer. The method and system also include patterning a resist layer. The resist layer includes a pattern having a plurality of apertures therein. The resist layer is for etching the first layer. A first portion of the first layer and a second portion of the anti-reflective coating layer are exposed by the pattern. The method and system also include etching the first portion of the first layer and the second portion of the anti-reflective coating layer and removing the resist layer utilizing a plasma etch. The anti-reflective coating layer is resistant to the plasma etch.

12 Claims, 7 Drawing Sheets

METHOD FOR REDUCING ANTI-REFLECTIVE COATING LAYER REMOVAL DURING REMOVAL OF PHOTORESIST

The present application is a divisional of U.S. Ser. No. 09/433,591, filed Nov. 2, 1999, and assigned of record to Advanced Micro Devices, Inc. of Sunnyvale, Calif.

FIELD OF THE INVENTION

The present invention relates to semiconductor devices, such as flash memory devices, more particularly to a method and system for reducing removal of the antireflective-coating layer during removal of the photoresist layer.

BACKGROUND OF THE INVENTION

A conventional semiconductor device, such as a conventional embedded flash memory, includes a large number of memory cells in a memory region. The memory cells are typically floating gate devices, such as floating gate transistors. The conventional embedded memory may also include logic devices in a second region, or core, of the conventional embedded memory. The logic and memory regions of the conventional embedded memory are typically processed separately.

FIG. 1 is a flow chart depicting a conventional method 10 for processing a portion of a conventional semiconductor device, such as a conventional embedded flash memory. A polysilicon layer is deposited across a semiconductor substrate, via step 12. The polysilicon layer is typically deposited on a thin insulating layer grown on the substrate. A conventional SiON anti-reflective coating layer of a desired thickness is then deposited, via step 14. The conventional anti-reflective coating layer must be deposited in a very narrow range of the desired thickness in step 14. This is because the anti-reflective properties of the conventional anti-reflective coating layer are highly dependent upon the thickness of the conventional anti-reflective coating layer. Typically, the desired thickness of the conventional anti-reflective coating layer is three hundred Angstroms plus or minus ten percent (thirty Angstroms).

A first photoresist layer is then patterned on the conventional anti-reflective coating layer, via step 16. The first photoresist layer pattern is typically obtained by spinning a layer of photoresist onto the anti-reflective coating layer and exposing portions of the photoresist layer to light through a mask layer to develop a pattern, or mask, in the photoresist layer. The first photoresist layer patterned in step 16 typically completely covers the logic region of the conventional imbedded memory. The first photoresist layer also includes a pattern over the memory region to define stacked gates in the memory region of the conventional embedded memory.

Once the first photoresist pattern has been defined, the stacked gates of the memory region are etched, via step 18. The first resist layer is then removed and residues cleaned using a wet etch, via step 20. A second photoresist pattern is then defined, via step 22. Step 22 typically includes spinning a second layer of photoresist onto the conventional embedded memory and developing the pattern of the second photoresist structure using conventional photolithography. Masking in the second photoresist layer defines gates in the logic region of the conventional imbedded memory, while the second photoresist layer also covers the memory region to ensure that processing of the logic region does not affect the memory region. The gates in the logic region are then etched, via step 24. The second photoresist layer may then be stripped and residues cleaned, via step 26. Processing of the conventional imbedded memory is then completed, via step 28.

Although the conventional method 10 can be used, one of ordinary skill in the art will readily understand that the conventional method 10 results variations in the critical dimension of structures fabricated in the logic region of the conventional embedded memory. When photoresist is spun onto the conventional embedded memory in steps 16 or 22, the photoresist will vary in thickness. This is particularly true when the topology of the layers under the photoresist is not flat.

Variations in the photoresist layer thickness cause variations in the critical dimension of structures desired to be formed, otherwise known as the swing curve effect. FIG. 2 is a graph 30 depicting the swing curve effect, variations in critical dimension versus photoresist thickness. The plot 31 indicates the desired size, or desired critical dimension, of a particular feature. The desired size is set by the design of the conventional embedded memory and thus is independent of resist thickness. The plot 32 depicts the variation in critical dimension versus photoresist thickness when a conventional anti-reflective coating layer of the appropriate thickness is used. Because the conventional anti-reflective coating layer of the appropriate thickness is used, reflections from the layer(s) underlying the photoresist layer are reduced. Thus, the structures formed using the photoresist layer have a critical dimension that is close to the desired critical dimension.

Curve 34 depicts the variation in the critical dimension for the structure of the desired size when no conventional anti-reflective coating layer or a conventional anti-reflective coating layer of an incorrect thickness is used. The anti-reflective properties of the anti-reflective coating layer are highly dependent on thickness of the anti-reflective coating layer. When a resist pattern is formed without the anti-reflective coating layer, light used in conventional photolithography may reflect off of the layer(s) and structures under the photoresist layer. The reflected light causes variations in critical dimensions of structures etched in the polysilicon layer and causes a phenomenon called reflective notching, a narrowing of the polysilicon lines as a result of reflections from the underlayer. Thus, the critical dimensions of structures fabricated with no conventional anti-reflective coating layer or a conventional anti-reflective coating layer without the desired thickness vary more strongly with photoresist thickness. This variation is shown in curve 34.

FIG. 3A depicts a portion of a conventional embedded memory 40 after step 16, patterning the first resist layer, is performed. The conventional embedded memory 40 includes a logic region 44 and a memory region 42. A polysilicon layer 51 is provided on substrate 50. Note that an insulating layer (not shown) typically separates the polysilicon layer 51 from the substrate 50. In addition, underlying structures 47 and 49 are shown. Structures 47 and 49 were obtained prior to deposition of the polysilicon layer 51. A conventional anti-reflective coating layer 52 having the desired thickness for reducing reflections is provided on the polysilicon layer 51. The thickness of the conventional anti-reflective coating layer 52 is typically three hundred Angstroms plus or minus approximately ten percent. The first photoresist structure 53 covers the logic region 44, but defines the pattern for stacked gates in the memory region 42. Note that the first photoresist structure 53 varies in thickness.

FIG. 3B depicts a portion of a conventional embedded memory 40 after step 18, etching gates in the memory region 42, of the method 10 shown in FIG. 1 is performed. Referring to FIG. 3B, stacked gates 54, 56 and 58 have been formed in the memory region 42 of the conventional embedded memory 40. The stacked gates 54, 56 and 58 are covered by remaining portions 55, 57 and 59, respectively, of the anti-reflective coating layer 52. Portions of the first photoresist layer 53 still covers the stacked gates 54, 56 and 58 as well as the polysilicon layer 51 and the conventional anti-reflective coating layer 52 in the logic region 44. Because the conventional anti-reflective coating layer 52 has the desired thickness, the critical dimensions of gates 54, 56 and 58 are quite close to what is desired. In other words, variations in the critical dimension of the gates 54, 56 and 58 may follow the curve 32 depicted in FIG. 2.

FIG. 3C depicts a portion of a conventional embedded memory 40 after step 20, stripping the first photoresist structure 53, of the method 10 shown in FIG. 1 is performed. Referring to FIG. 3C, a portion of the conventional anti-reflective coating layer 52 has been removed during the strip of the photoresist structure 53. Thus, the conventional anti-reflective coating layer 52 is thinner than in FIG. 3B. Typically, twenty to fifty Angstroms are removed during the wet resist strip after the etch performed in step 20. After the etch, the thickness of the conventional anti-reflective coating layer 52 is twenty to fifty Angstroms thinner than the optimal thickness. Consequently, removal of a portion of the conventional anti-reflective coating layer 52 during the resist strip is likely to significantly reduce the ability of the conventional anti-reflective coating layer 52 to decrease reflections. Thus, the gates formed in step 24 in the logic region 44 will have critical dimensions which vary greatly. In other words, the critical dimensions of structures, such as gates, in the logic region will follow the curve 44 shown in FIG. 2. These large variations are undesirable. In order to reduce these variations in the logic region 44, the anti-reflective coating layer 52 and photoresist structure 53 would be removed. The anti-reflective coating layer 52 would then be replaced with another anti-reflective coating layer (not shown) that is deposited at the desired thickness.

Accordingly, what is needed is a system and method for providing the conventional semiconductor device, such as an embedded memory, in which the anti-reflective coating layer need not be removed and redeposited. The present invention addresses such a need.

SUMMARY OF THE INVENTION

The present invention provides a method and system for providing a semiconductor device. The semiconductor device includes a first layer to be etched. The method and system comprise depositing an anti-reflective coating. The method and system also comprise patterning a resist layer, the resist layer has a pattern including a plurality of apertures therein. The resist layer is for etching the first layer. A first portion of the first layer and a second portion of the anti-reflective coating layer are exposed by the pattern. The method and system also comprise etching the first portion of the first layer and the second portion of the anti-reflective coating layer and removing the resist layer utilizing a plasma etch. The anti-reflective coating layer is resistant to the plasma etch.

According to the system and method disclosed herein, the present invention reduces the removal of the anti-reflective coating layer by using a plasma etch to strip photoresist. The anti-reflective coating layer is resistant to removal by the plasma etch. Consequently, the anti-reflective coating properties of the anti-reflective coating layer are preserved, allowing a reduction in the swing curve effect and reflective notching.

DETAILED DESCRIPTION OF THE INVENTION

Figure 1:
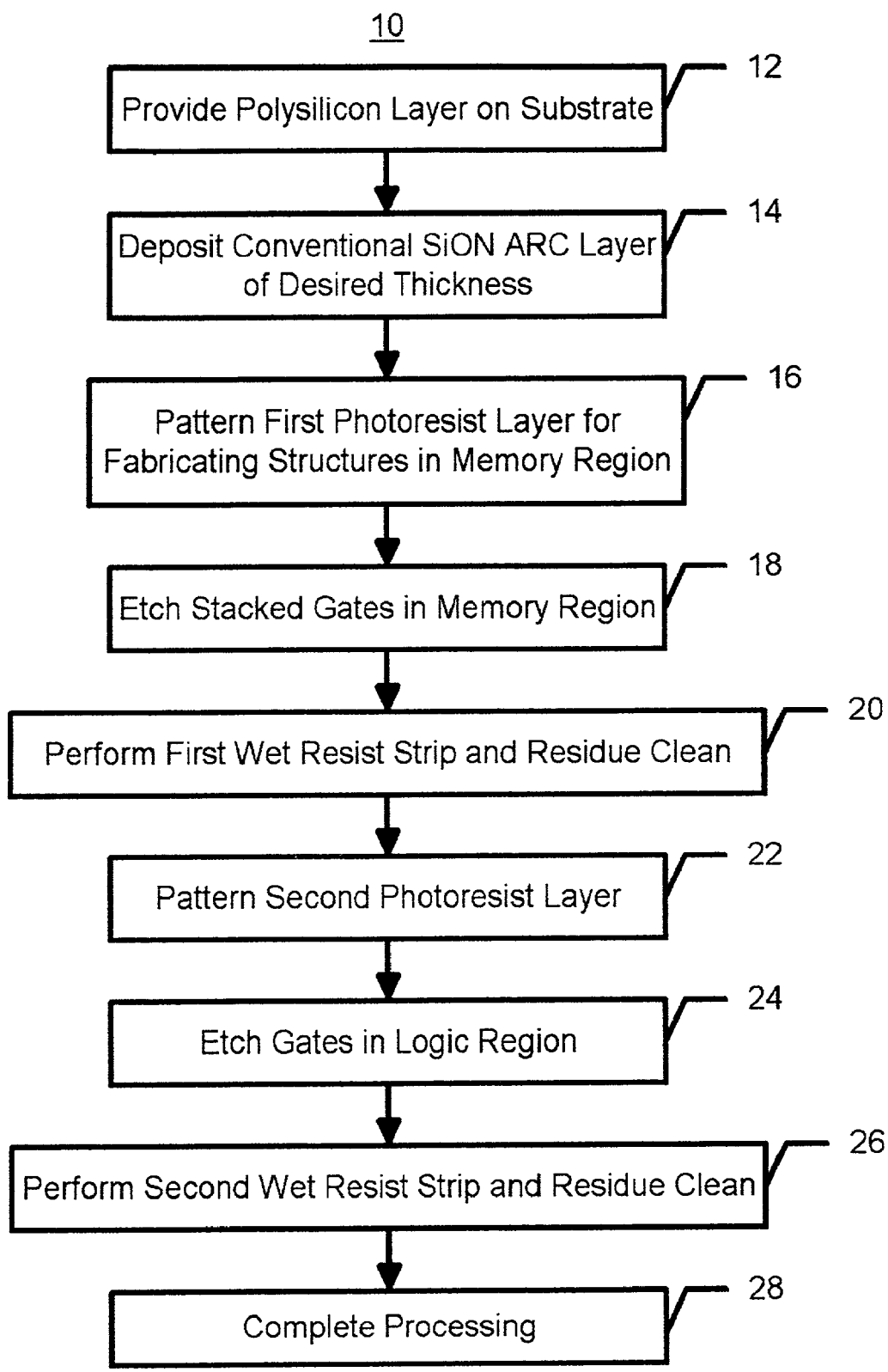
FIG. 1 is a flow chart of a conventional method for providing a portion of semiconductor device
Figure 2:
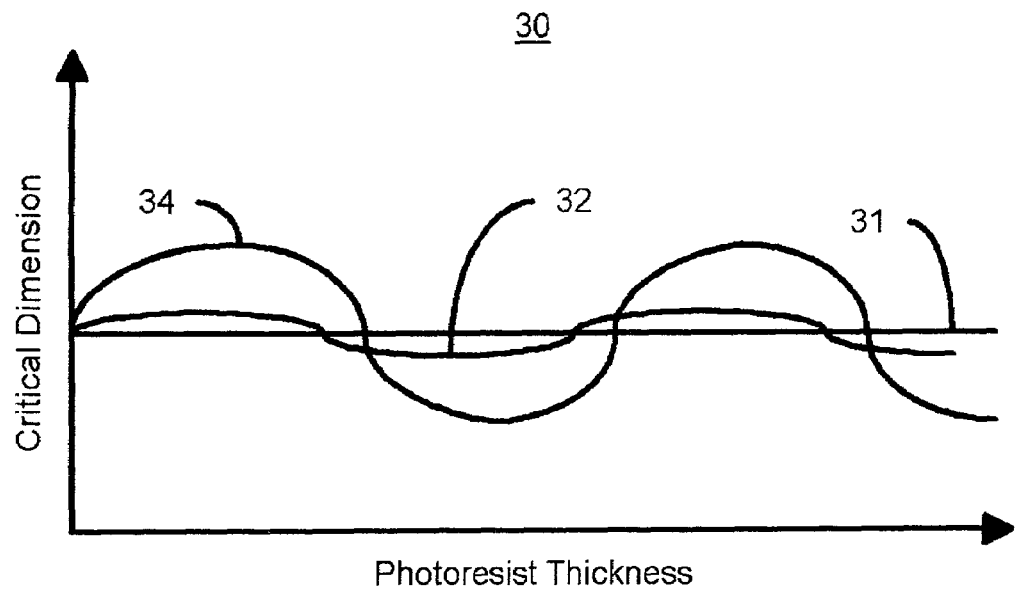
FIG. 2 is a graph depicting the variation in critical dimension versus photoresist thickness.
Figure 3A:
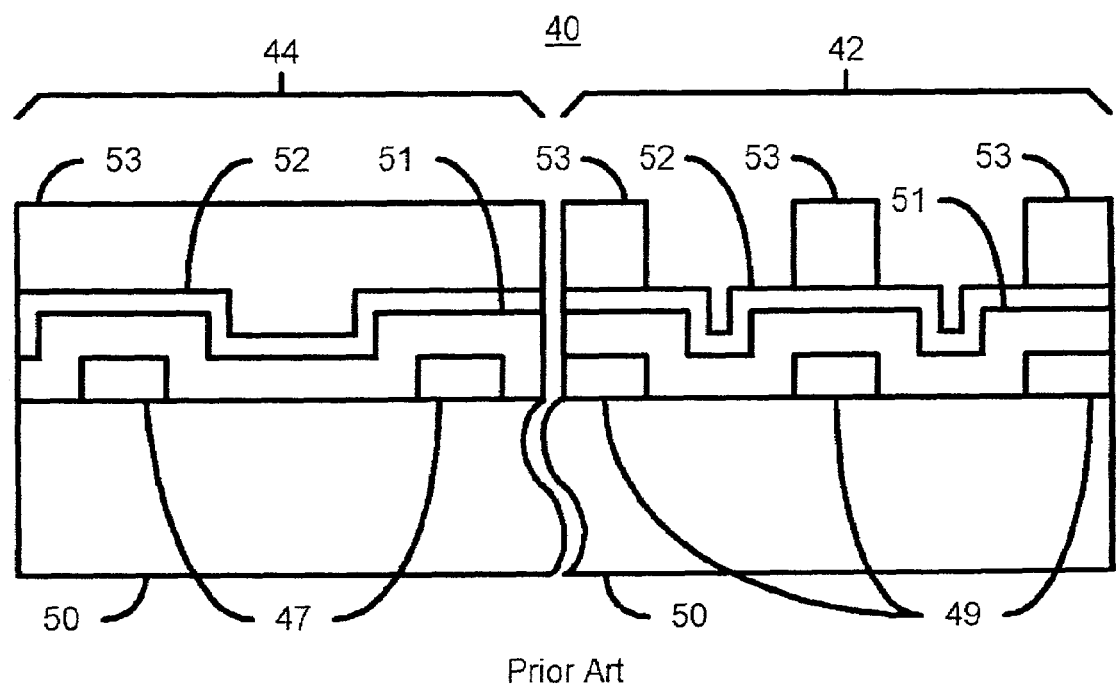
FIG. 3A is diagram of a portion of a conventional embedded memory after the first photoresist layer has been patterned.
Figure 3B:
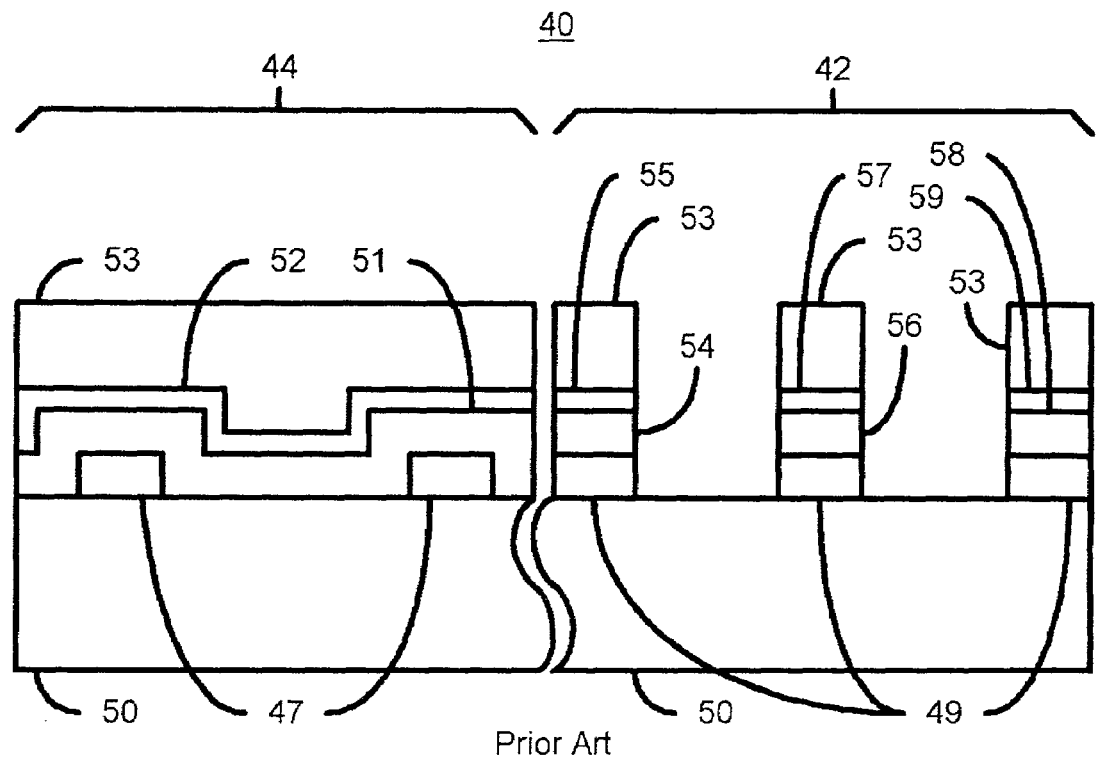
FIG. 3B is a diagram of a portion of the conventional embedded memory after the stacked gates have been etched.
Figure 3C:
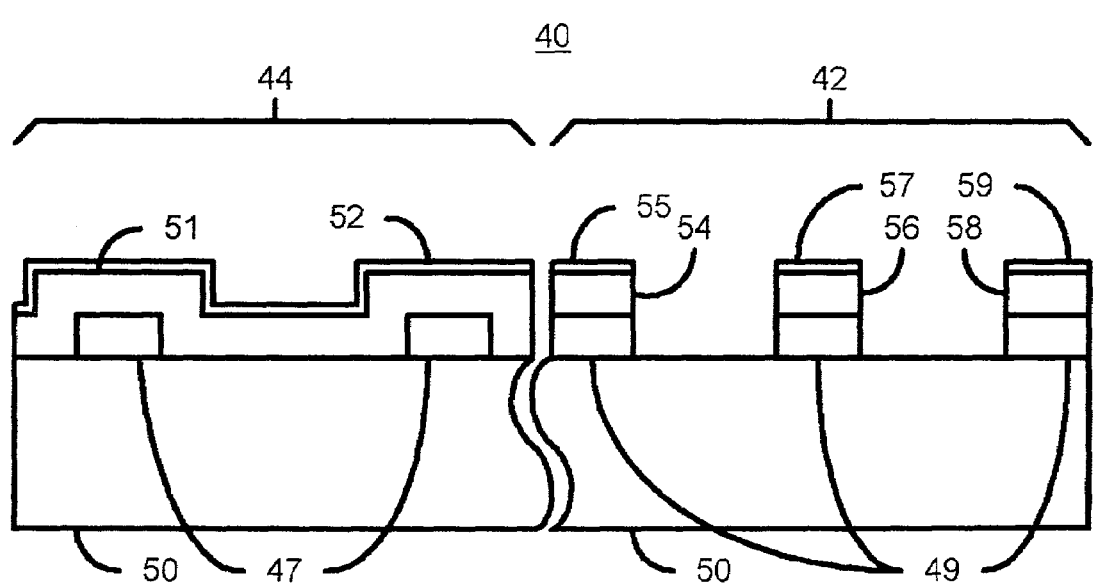
FIG. 3C is a diagram of a portion of the conventional embedded memory after the first photoresist layer has been removed and residues cleaned.

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional semiconductor devices are typically processed using conventional anti-reflective coating layers. For example, a conventional semiconductor device, such as an embedded flash memory, contains a logic region and a memory region. In order to pattern gates with a narrow distribution of the critical dimension in the logic region and the memory region, a conventional anti-reflective coating layer is deposited on a polysilicon layer. The conventional anti-reflective coating layer is typically SiON. The anti-reflective properties of the conventional anti-reflective coating layer are highly dependent on the thickness of the conventional anti-reflective coating layer. Typically, the conventional anti-reflective coating layer has a desired thickness of three hundred Angstroms plus or minus approximately thirty Angstroms thick. Outside of the desired thickness, the conventional anti-reflective coating layer may not adequately reduce or prevent reflections.

Typically, the conventional anti-reflective coating layer is deposited with the desired thickness. The gates in the memory portion of the conventional embedded memory are then patterned. Typically, this includes patterning a first layer of photoresist and etching the polysilicon and conventional anti-reflective coating layer. The first layer of photoresist completely covers the logic region of the conventional memory and is patterned in the memory region. After the stacked gates are etched, the first photoresist layer is stripped using a wet chemical. The gates in the logic portion of the conventional embedded memory are then patterned. This step is typically performed by patterning a second photoresist layer and etching the polysilicon and conventional anti-reflective coating layer under apertures in the second photoresist layer. For this step, the second photoresist layer typically covers the memory region and is patterned in the logic region of the conventional embedded memory. Thus, the gates in the memory region and the gates in the logic region are processed independently.

The stripping of the photoresist structure after gates in the memory region are formed using the first etch removes a significant portion of the conventional anti-reflective coating layer, typically twenty to fifty Angstroms. The desired thickness of the conventional anti-reflective coating layer is approximately three hundred Angstroms plus or minus about ten percent. Thus, removal of a portion of the conventional anti-reflective coating layer during the photoresist strip may take the conventional anti-reflective coating layer far enough away from the desired thickness that the conventional anti-reflective coating layer is no longer efficient. Thus, when the structures, such as gates, in the logic region are formed, the critical dimension of the structures varies greatly due to the swing curve effect and reflective notching.

One method for remedying this would be to deposit a thicker conventional anti-reflective coating layer at the outset. Once the first photoresist structure is stripped, the conventional anti-reflective coating layer would have the desired thickness. Variations of the critical dimensions of structures in the logic region due to the swing curve effect would be reduced. However, because the conventional anti-reflective coating layer was thicker as provided, the conventional anti-reflective coating layer might not function properly for processing of the memory region. Thus, variations in the critical dimensions of structures in the memory region due to the swing curve effect or reflective notching would be greatly increased.

The present invention provides a method and system for providing a semiconductor device. The semiconductor device includes a first layer to be etched. The method and system comprise depositing an anti-reflective coating. The method and system also comprise patterning a resist layer. The resist layer has a pattern including a plurality of apertures therein. The resist layer is for etching the first layer. A first portion of the first layer and a second portion of the anti-reflective coating layer are exposed by the pattern. The method and system also comprise etching the first portion of the first layer and the second portion of the anti-reflective coating layer and removing the resist layer utilizing a plasma etch. The anti-reflective coating layer is resistant to the plasma etch.

The present invention will be described in terms of a particular device having certain components and particular techniques for performing certain steps, such as the use of a particular capping layer having a certain thickness. However, one of ordinary skill in the art will readily recognize that this method and system will operate effectively for other devices having other components and other techniques. Furthermore, the present invention will be described in terms of a particular semiconductor memory device, an embedded memory. However, nothing prevents the method and system from being utilized with another semiconductor device.

Figure 4A:
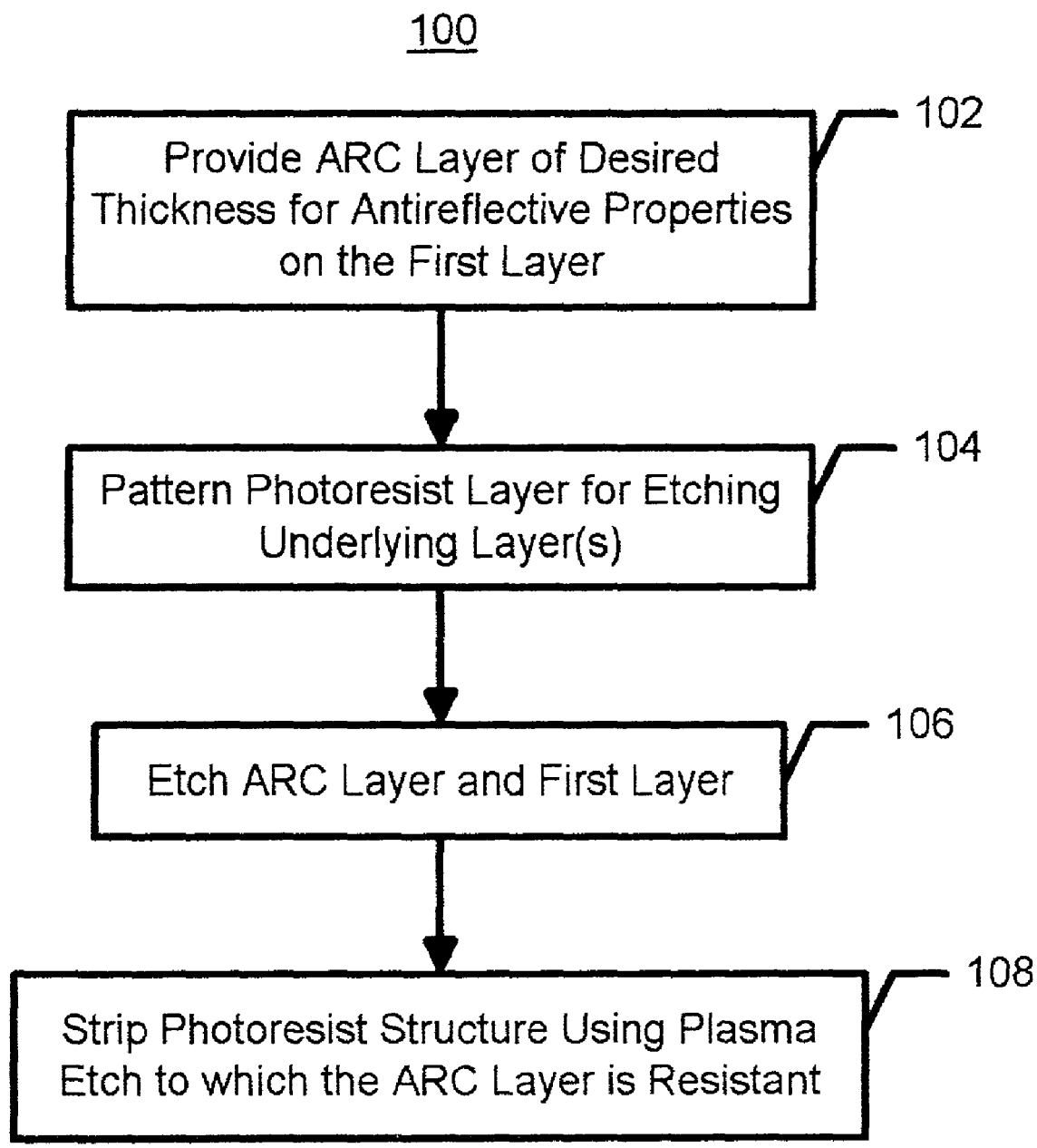
FIG. 4A is a flow chart depicting one embodiment of a method for providing a portion of a semiconductor device and an anti-reflective coating layer in accordance with the present invention. invention.

To more particularly illustrate the method and system in accordance with the present invention, refer now to FIG. 4A, depicting one embodiment of a method 100 in accordance with the present invention for providing a semiconductor device such as an embedded memory. The memory 100 preferably commences after a first layer to be etched has been provided. In a preferred embodiment, the method 100 commences after a polysilicon layer desired to be patterned has been deposited. The polysilicon layer is to be patterned into stacked gates and logic gates. An anti-reflective coating layer of a desired thickness is provided, preferably by depositing the anti-reflective coating layer, via step 102. Preferably, the anti-reflective coating layer deposited in step 102 is a SiON layer. Also in a preferred embodiment, the desired thickness of the anti-reflective coating layer is the thickness desired for maximizing the anti-reflective properties of the anti-reflective coating layer. In one embodiment, this thickness is three hundred Angstroms plus or minus ten percent. However, the anti-reflective coating layer may have another desired thickness. For example, in some other applications, the desired thickness of the anti-reflective coating layer may be one hundred to five hundred Angstroms. A photoresist layer is then patterned on the anti-reflective coating layer, via step 104. The photoresist structure includes a pattern which has apertures over the regions desired to be etched and covers regions desired to be preserved. The anti-reflective coating layer and underlying first layer are then etched, via step 104. Because the anti-reflective coating layer has the desired thickness, variations in the critical dimensions of structures etched into the first layer due to variations in the thickness of the photoresist structure are reduced. Thus, gates may be formed in a region of the embedded memory. The photoresist layer is then etched using a plasma etch to which the anti-reflective coating layer is resistant, via step 108. Thus, the anti-reflective coating layer is resistant to removal by the plasma etch. In contrast, the photoresist structure is layer by the plasma etch. In other words, the selectivity of the etch for the photoresist is relatively high, while the selectivity of the etch for the anti-reflective coating layer is relatively low. Consequently, little or none of the anti-reflective coating layer is removed when the photoresist structure is removed. Because the anti-reflective coating layer is protected from removal, the anti-reflective properties of the anti-reflective coating layer are preserved for later use. As a result, the critical dimensions of the structures formed using the anti-reflective coating layer after removal of the photoresist structure will not vary greatly due to the swing curve effect.

Figure 4B:
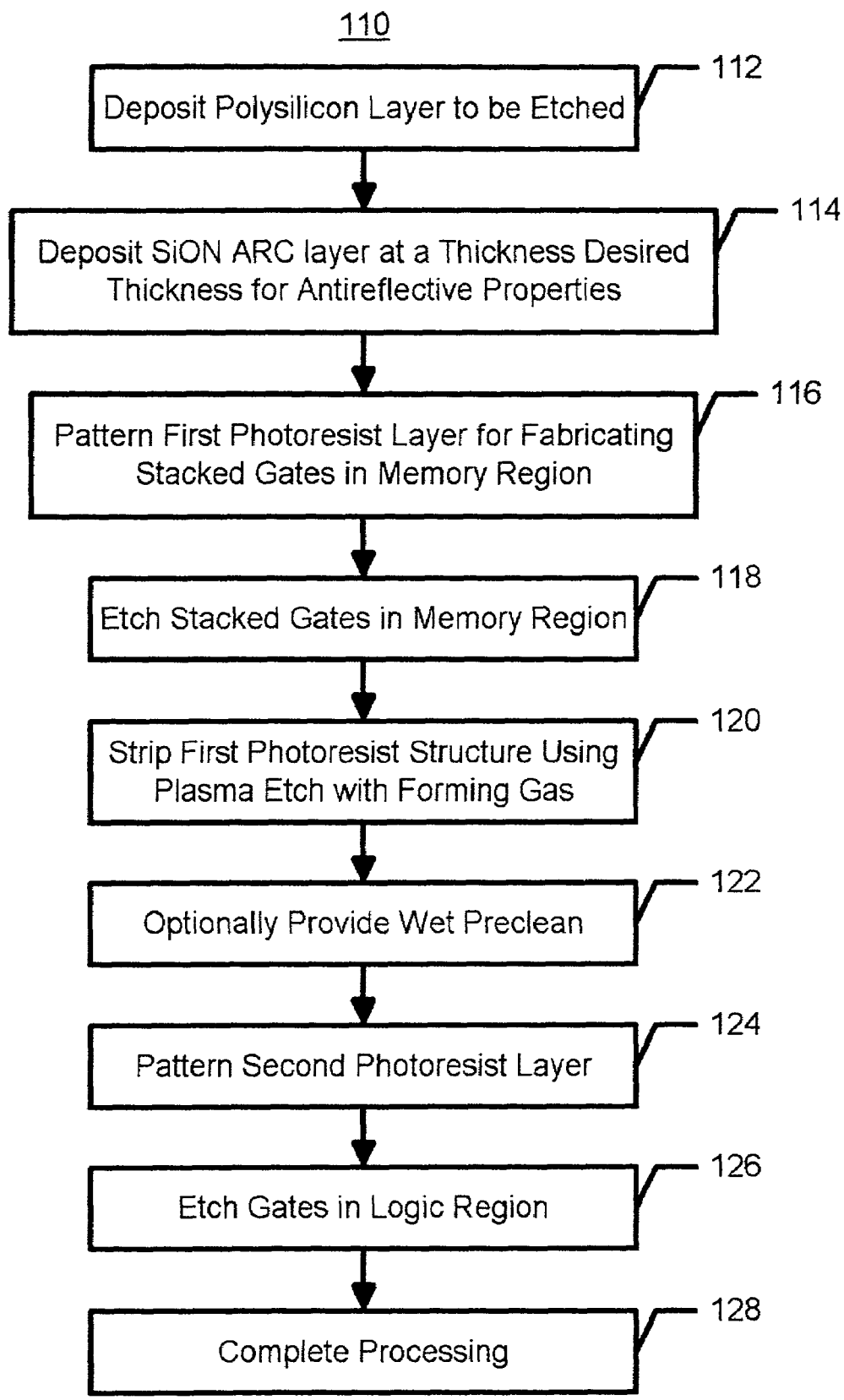
FIG. 4B is a more detailed flow chart depicting one embodiment of a method for providing a portion of a semiconductor device in accordance with the present invention.

FIG. 4B depicts a more detailed flow chart of a method for providing a portion of a semiconductor device, such as an embedded memory, which has a logic region and a memory region. A polysilicon layer is deposited on a semiconductor substrate, via step 112. The polysilicon layer is analogous to the first layer discussed with respect to FIG. 4A. The polysilicon layer is to be patterned into the stacked and logic gates. Referring back to FIG. 4B, a SiON anti-reflective coating layer is deposited at the desired thickness for anti-reflective properties of the SiON anti-reflective coating layer, via step 114. In a preferred embodiment, the desired thickness is approximately three hundred Angstroms plus or minus approximately thirty Angstroms. A first resist structure is then patterned, via step 116. Preferably, step 116 includes spin-coating photoresist on the embedded memory and developing a pattern in the photoresist using photolithography. The first resist layer includes a pattern that has apertures over a first region and covers a second region. Thus, the first resist structure is for fabricating structures in the first region of the embedded memory. In a preferred embodiment, the first resist structure is for providing stacked gates in the memory region of the embedded memory. Thus, in a preferred embodiment, the first region of the embedded memory is the memory region. The structures in the first region are then defined using an etch, via step 118. The first photoresist structure is then stripped using a plasma etch that uses a plasma including a forming gas, via step 120. The plasma used in step 120 thus etches the photoresist. However, the anti-reflective coating layer is resistant to removal by the plasma used in step 120. Consequently, the photoresist strip performed in step 120 removes little or none of the anti-reflective coating layer.

An optional wet preclean, for example using sulfuric acid, may then be performed, via step 122. The wet preclean removes any remaining residues from the plasma etch performed in step 122. Although the anti-reflective coating layer is exposed to the wet etchant in the wet preclean, the preclean is only used to remove residues. Consequently, exposure of the anti-reflective coating layer to the wet etchant is greatly reduced. Thus, the amount of the anti-reflective coating layer removed by the wet etchant is still greatly reduced over the amount of the anti-reflective coating layer removed by a conventional photoresist strip.

A second resist layer for a second portion of the semiconductor device is then patterned, via step 124. Preferably, step 124 includes spin-coating photoresist ont eh embedded memory and developing a pattern in the photoresist using photolithography. The second resist layer has a pattern including apertures over the second region and covers the first region. Thus, the second resist layer is for fabricating structures in the second region of the embedded memory. In a preferred embodiment, the second resist layer is for providing gates in the logic region of the embedded memory. Thus, in a preferred embodiment, the second region of the embedded memory is the logic region. The structures in the second region of the semiconductor device are then etched, via step 126. Thus, gates in the logic region may be defined in step 126. Processing of the embedded memory may be completed, via step 128. Step 128 thus includes stripping the second photoresist layer and performing any subsequent processing steps. Step 128 may also include removing the anti-reflective coating layer prior to formation of subsequent structures.

Because the photoresist is stripped using a plasma etch to which the anti-reflective coating layer is resistant, the anti-reflective coating layer is less susceptible to removal by the photoresist strip in accordance with the present invention. In one embodiment, the photoresist strip in accordance with the present invention does not remove any of the anti-reflective coating layer. In another embodiment, a photoresist strip removes in accordance with the present invention only a small portion of the anti-reflective coating layer. This portion is small enough to allow the anti-reflective coating layer to continue to act as an anti-relfective layer. The preservation of most or all fo the anti-reflective coating layer is in contrast to removal of ten to twenty Angstroms of a conventional anti-reflective coating layer using a conventional wet photoresist strip. Because the anti-reflective coating layer is less subject to removal by a photoresist strip in accordance with the present invention, the thickness of the anti-reflective coating layer is preserved for fabrication of structures in the second portions of a semiconductor device. The anti-reflective coating layer can thus still reduce the variation of the critical dimensions of structures fabricated. Furthermore, because the anti-reflective coating layer has the desired thickness as provided, the variations in the critical dimensions of structures fabricated in the first region are also reduced. For example, the stacked gates of the memory region and the gates of the logic region can both be formed without being subject to wide variations in critical dimension due to the swing curve effect. Consequently, processing of a semiconductor device, such as an embedded memory, is facilitated.

Figure 5A:
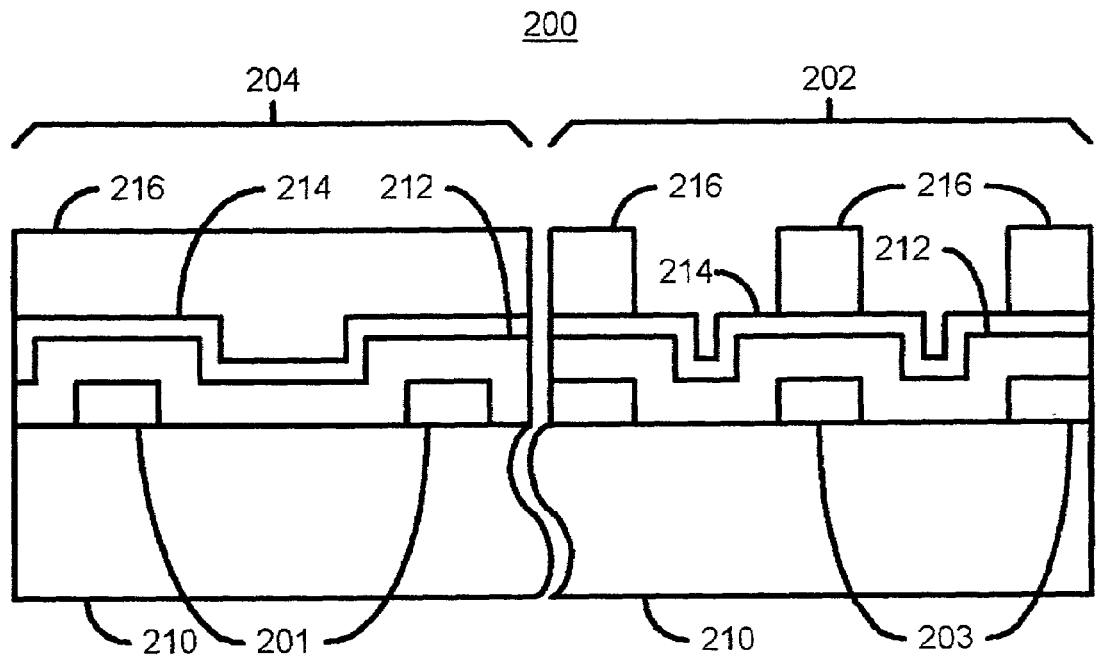
FIG. 5A is a diagram depicting one embodiment of a semiconductor device in accordance with the present invention after the first photoresist structure has been provided.
Figure 5B:
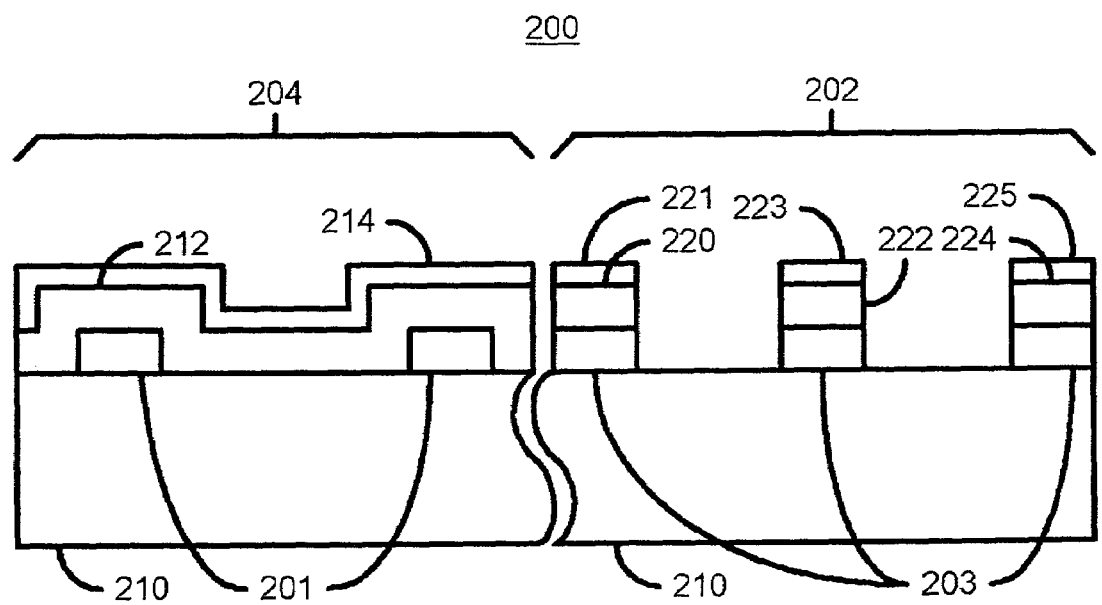
FIG. 5B is a diagram depicting one embodiment of a semiconductor device in accordance with the present invention after the first photoresist structure has been stripped.
Figure 5C:
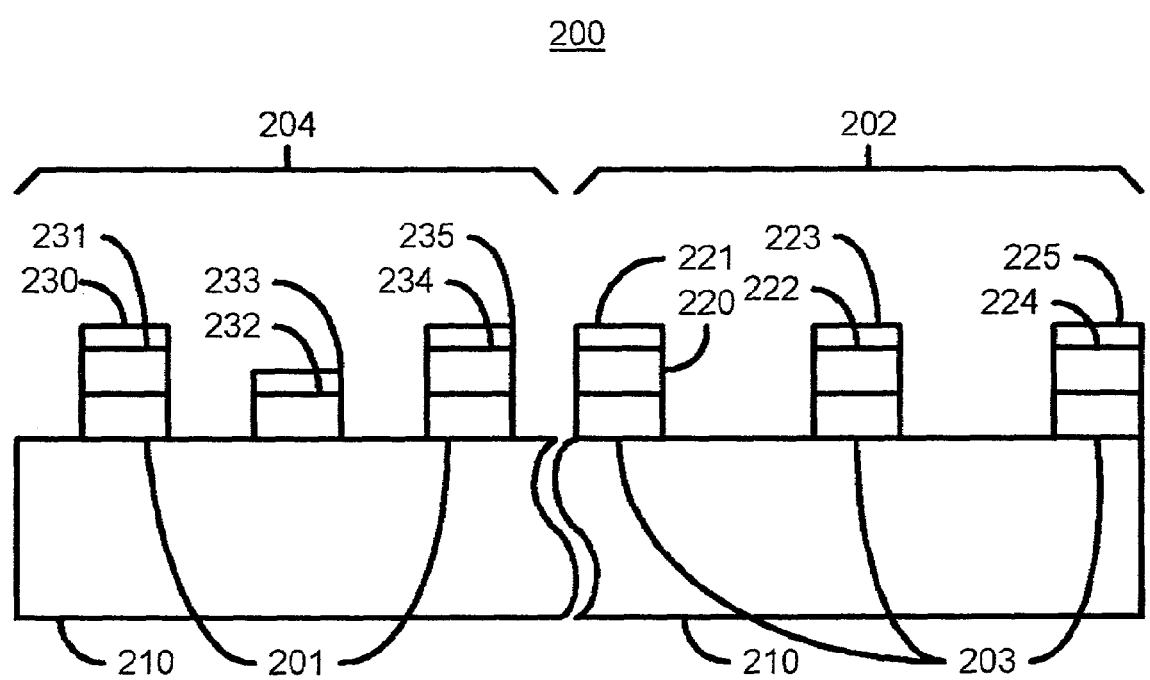
FIG. 5C is a diagram depicting one embodiment of a semiconductor device in accordance with the present invention after the second photoresist structure has been stripped.

For example, refer to FIGS. 5A–5C, depicting an embedded memory 200 during processing in accordance with the methods 100 or 110. FIG. 5A depicts the embedded memory 200 after step 104 or 116 of patterning the first photoresist structure has been performed. The embedded memory 200 includes a memory region 202 and a logic region 204. A polysilicon layer 212 has been deposited on a substrate 210. The polysilicon layer 212 is generally separated from the substrate 210 by a thin insulating layer (not shown). In addition, underlying structure 201 and 203 in the logic and memory regions, respectively, are shown. The anti-reflective coating layer 214 has been provided on the polysilicon layer 212 at the desired thickness. The photoresist structure 216 has also been provided. The photoresist structure 216 includes apertures exposing the anti-reflective coating layer 214 and the underlying polysilicon layer 212.

FIG. 5B depicts the semiconductor device 200 after the first resist layer has been stripped using a photoresist strip in accordance with the present invention, such as in steps 108 or 120. The stacked gates 220, 222 and 224 have been provided in the memory region 202. Because of the etching, only portions 221, 223 and 225 of the anti-reflective coating layer 214 remain in the memory region 202. Because the anti-reflective coating layer was deposited at approximately the desired thickness, the stacked gates 220, 222 and 224 have critical dimensions close to what is desired. Thus, the anti-reflective coating layer 214 has greatly reduced the swing curve effect in the memory region. No structures have been formed in the logic region 202. Furthermore, the resist strip using the plasma etch has not greatly affected the thickness of the anti-reflective coating layer 214 because the anti-reflective coating layer is resistant to removal by the plasma etch. Consequently, the anti-reflective coating layer 214 still retains sufficient anti-reflective properties to be used in fabricating structures in the logic region 204.

FIG. 5C depicts the semiconductor device 200 after removal of the second resist structure. Thus, the gates 230, 232 and 234 have been defined in the logic region 204. Because of the presence of the anti-reflective coating layer 214, remaining as regions 231, 233 and 235, the critical dimensions of structures in the logic region 204 do not vary greatly. Thus, the swing curve effect has been greatly reduced in the logic region 204 of the embedded memory 200. Thus, processing of the embedded memory 200 is facilitated.

A method and system has been disclosed for using a plasma etch, which an anti-reflective coating layer is resistant to, in order to remove a photoresist structure. Thus, the anti-reflective coating layer is preserved for subsequent use. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method of providing a semiconductor device, the semiconductor device including a first layer desired to be etched, the method comprising the steps of:
   (a) providing an anti-reflective coating layer having anti-reflective properties, wherein the anti-reflective coating layer comprises a layer of SiON having a thickness of less than about 500 Angstroms (Å) deposited on the first layer;
   (b) patterning a resist layer, the resist layer including a pattern having a plurality of apertures therein for etching a first portion of the first layer, wherein the first portion corresponds to a memory region of the semiconductor device;
   (c) etching the first portion of the first layer;
   (d) removing the resist layer utilizing a plasma etch, the anti-reflective coating layer being resistant to the plasma etch;
   (e) patterning a second resist layer, the second resist layer including a pattern having a plurality of apertures therein for etching a second portion of the first layer, wherein the second portion corresponds to a logic region of the semiconductor device; and
   (f) etching the second portion of the first layer.

2. The method of claim 1 wherein the anti-reflective coating layer providing step (a) further includes the steps of:
   (a1) depositing the anti-reflective coating layer.

3. The method of claim 1 wherein the resist layer removing step (d) further includes the step of:
   (d1) performing the plasma etch using a plasma including a forming gas, the anti-reflective coating layer being resistant to the plasma etch using the plasma including the forming gas.

4. A method of providing a semiconductor device, the semiconductor device including a first layer desired to be etched, the method comprising the steps of:
   (a) providing an anti-reflective coating layer having anti-reflective properties, wherein the anti-reflective coating layer comprises a layer of SiON having a thickness of less than about 500 Angstroms (Å) deposited on the first layer;
   (b) patterning a resist layer, the resist layer including a pattern having a plurality of apertures therein for etching a first portion of the first layer;
   (c) etching the first portion of the first layer;
   (d) removing the resist layer utilizing a plasma etch, the anti-reflective coating layer being resistant to the plasma etch;
   (e) patterning a second resist layer, the second resist layer including a pattern having a plurality of apertures therein for etching a second portion of the first layer; and
   (f) etching the second portion of the first layer; wherein the resist layer removing step (d) further includes the step of:
      (d1) performing the plasma etch using a plasma including a forming gas, the anti-reflective coating layer being resistant to the plasma etch using the plasma including the forming gas;
   wherein the plasma further includes four percent of the forming gas.

5. A method of providing a semiconductor device, the semiconductor device including a first layer desired to be etched, the method comprising the steps of:
   (a) providing an anti-reflective coating layer having anti-reflective properties, wherein the anti-reflective coating layer comprises a layer of SiON having a thickness of less than about 500 Angstroms (Å) deposited on the first layer;
   (b) patterning a resist layer, the resist layer including a pattern having a plurality of apertures therein for etching a first portion of the first layer;
   etching the first portion of the first layer;
   (d) removing the resist layer utilizing a plasma etch, the anti-reflective coating layer being resistant to the plasma etch;
   (e) patterning a second resist layer, the second resist layer including a pattern having a plurality of apertures therein for etching a second portion of the first layer; and
   (f) etching the second portion of the first layer; wherein the resist layer removing step (d) further includes the step of:
      (d1) performing the plasma etch using a plasma including a forming gas, the anti-reflective coating layer being resistant to the plasma etch using the plasma including the forming gas; and
      (d2) providing a wet preclean after the plasma etching step (d1).

6. A method of providing a semiconductor device, the semiconductor device including a first layer desired to be etched, the method comprising the steps of:
   (a) providing an anti-reflective coating layer having anti-reflective properties, wherein the anti-reflective coating layer comprises a layer of SiON having a thickness of less than about 500 Angstroms (Å) deposited on the first layer;
   (b) patterning a resist layer, the resist layer including a pattern having a plurality of apertures therein for etching a first portion of the first layer;
   (c) etching the first portion of the first layer;
   (d) removing the resist layer utilizing a plasma etch, the anti-reflective coating layer being resistant to the plasma etch;
   (e) patterning a second resist layer, the second resist layer including a pattern having a plurality of apertures therein for etching a second portion of the first layer; and
   (f) etching the second portion of the first layer;
   wherein a thickness of the SiON anti-reflective coating layer is three hundred Angstroms plus or minus no more than approximately ten percent.

7. A method of providing a semiconductor device including first and second regions having, respectively, first and second types of circuit structures, the method comprising:
   depositing a first layer on a substrate;
   depositing a layer of SiON on the first layer;
   depositing a first resist layer on the SiON layer;
   patterning the first resist layer for etching the first layer in the first region of the semiconductor device;
   etching the first layer in the first region of the semiconductor device;
   removing the first resist layer utilizing a plasma etch;
   depositing a second resist layer on the SiON layer;
   patterning the second resist layer for etching the first layer in the second region of the semiconductor device;
   etching the first layer in the second region of the semiconductor device;

removing the second resist layer; and removing the SiON layer.

8. The method of claim 7 wherein the SiON layer has a thickness of less than about 500 Angstroms.

9. The method of claim 7 wherein the SiON layer has a thickness of about 300 Angstroms.

10. The method of claim 9 wherein the SiON layer has a thickness of between about 270 and about 300 Angstroms.

11. The method of claim 7 wherein the first type of circuit structure comprises structures for forming memory cells and the second type of circuit structure comprises structures for forming logic circuits.

12. A method for reducing anti-reflective coating layer removal comprising the steps of:

depositing an anti-reflective coating layer on a first layer, wherein said anti-reflective coating layer comprises a layer of SiON having a thickness of less than 500 Angstroms (Å);

patterning a first resist layer on said anti-reflective coating layer, wherein said first resist layer comprises a pattern having a plurality of apertures therein for etching a first portion of said first layer;

etching said first portion of said first layer;

removing said first resist layer utilizing a plasma etch after said first portion of said first layer is etched, wherein said anti-reflective coating layer is resistant to said plasma etch;

patterning a second resist layer, wherein said second resist layer comprises a pattern having a plurality of apertures therein for etching a second portion of said first layer; and etching said second portion of said first layer.

* * * * *